OSCILLATOR WITH DUAL FUNCTION ISOLATION AMPLIFIER AND FREQUENCY DETERMINING TRANSISTOR

Filed Aug. 6, 1962

INVENTOR
RICHARD H. BANGERT
BY Grover C. Frater
ATTORNEY

July 12, 1966 R. H. BANGERT 3,260,960

OSCILLATOR WITH DUAL FUNCTION ISOLATION AMPLIFIER AND FREQUENCY DETERMINING TRANSISTOR

Filed Aug. 6, 1962 2 Sheets-Sheet 2

INVENTOR
RICHARD H. BANGERT
BY Grover A. Frater
ATTORNEY 3,260,960
Patented July 12, 1966

3,260,960

OSCILLATOR WITH DUAL FUNCTION ISOLATION AMPLIFIER AND FREQUENCY DETERMINING TRANSISTOR

Richard H. Bangert, Davenport, Iowa, assignor to The Bendix Corporation, Davenport, Iowa, a corporation of Delaware Filed Aug. 6, 1962, Ser. No. 215,109
1 Claim. (Cl. 331—65)

This invention relates to improvements in frequency control of electronic oscillators.

An object of the invention is to provide improved methods and means for controlling oscillator frequency in accordance with a condition and to provide such control with a minimum number of components whereby to increase reliability while decreasing size and weight.

The invention is applicable to oscillator-amplifier combinations. The capacitive reactance of a semiconductor junction, which advantageously comprises the active element of the amplifier, is coupled into the frequency determining circuit of the oscillator. Means are provided for altering the unidirectional current flow across the junction as a function of the control condition. Since the capacitive reactance of the junction varies with current flow across the junction, the result is oscillator frequency control by variation of unidirectional current flow.

Such junction control may also be exercised by controlling current flow across a semiconductor junction in the active element of the oscillator as described in U.S. application Serial Number 168,176 filed January 23, 1962, and assigned to The Bendix Corporation. Control through the medium of a junction in the amplifier has, in itself, certain advantages over control in the oscillator. However, it will be apparent that certain very significant advantages arise from the simultaneous use of both control schemes.

The invention is applicable to control of the sort in which oscillator frequency is varied in accordance with a condition and it is applicable to control of the sort in which oscillator frequency is held constant despite changes in the condition. In the embodiment selected for illustration, both sorts of control are exercised. Thus the embodiment shown includes means for varying oscillator frequency as a function of pressure differential and means for controlling the oscillator such that its frequency is independent of temperature change. In this particular embodiment the primary frequency control element is a piezoelectric crystal. The crystal fresuency is "pulled" as a function of a first variable by altering current flow across a semiconductor junction in the oscillator. The frequency of crystal operation is made independent of temperature by appropriately altering current flow across a semiconductor junction in the amplifier. It is to be understood that various modifications may be made in the embodiment shown and that other embodiments are possible without departing from the spirit of the invention and the scope of the appended claim.

The equivalent circuit of a piezoelectric crystal includes the parallel combination of capacitance in one branch and series inductance, capacitance and reactance in another branch. It is a criteria for sustained oscillation at any frequency that the phase shift around the oscillatory circuit be an integral multiple of 360 degrees. If the remainder of the oscillator circuit (other than the crystal) exhibits reactance at the oscillator frequency, then the crystal must exhibit equal and opposite reactance. In this circumstance the crystal operates at other than its resonant frequency. If the reactance of the remainder of the circuit is altered, then crystal reactance must be altered and this is accomplished by a change in crystal frequency. The frequency is then said to have been "pulled." Conversely, if the value of a capacitor or inductor in the equivalent circuit of a crystal is altered as an incident to temperature change in the crystal, then the reactance of the crystal at a given frequency will change. If the reactance of the remainder of the circuit is unchanged by temperature, then the crystal frequency must change until its reactance is returned to the value it had prior to the change.

In the case of compensation to prevent change in oscillator frequency as an incident to temperature change, when crystal temperature changes there is a change in the reactance it exhibits at the desired frequency. Compensation is effected by changing the reactance of the remainder of the circuit by an equal but opposite amount.

Figure 1:
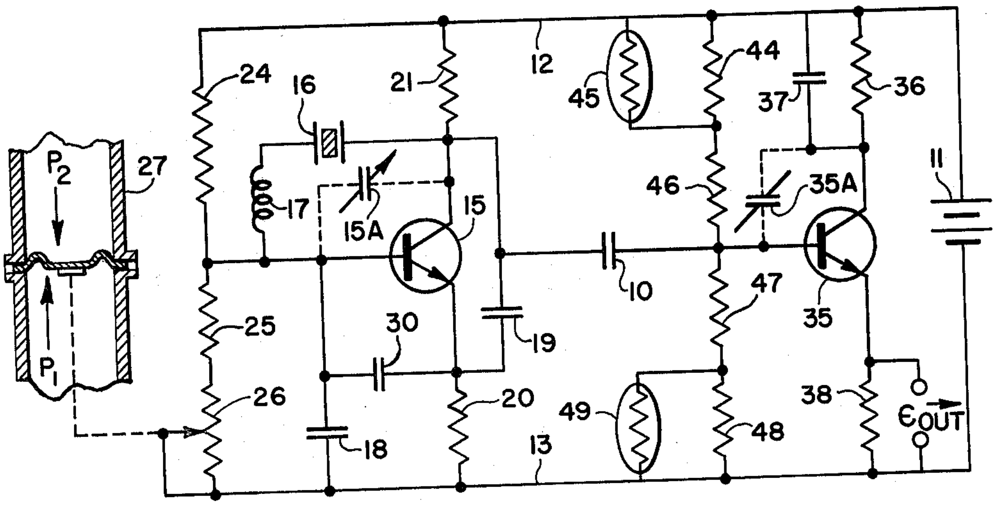
FIG. 1 is a circuit diagram of an oscillator amplifier combination to which a pressure transducer, shown schematically, is connected, the whole embodying the invention.

Referring to FIG. 1, the circuit shown comprises a crystal oscillator and amplifier combination coupled together through a coupling capacitor 10. Power is supplied by a source, here battery 11, connected across a positive line 12 and a negative, and grounded, line 13.

The oscillator comprises a transistor 15 having a piezoelectric crystal 16 and inductor 17 connected in series between the transistor collector and base. A radio frequency by-pass capacitor 18 connects the base with ground line 13. A frequency control or "tank" capacitor 19 is connected between the collector and the emitter of transistor 15 and the emitter is connected to ground through biasing resistor 20. A load resistor 21 connects the collector with positive line 12. The D.C. voltage and current levels are established in a voltage divider network comprising, in order and in series circuit from line 12 to line 13, a resistor 24, a junction point connected to the base of transistor 15, and the series combination of a resistor 25 and a variable resistor 26. The latter is varied in accordance with differential pressure (the difference between pressures $P_1$ and $P_2$) by a transducer 27. The remaining element, capacitor 30 is connected between the emitter and base of transistor 15. The source 11 offers low impedance to alternating currents whereby lines 13 and 12 are effectively at the same alternating potential. Accordingly, this arrangement of capacitor 18 serves to eliminate resistors 24, 25, and 26 from the equivalent alternating current circuit of the oscillator. Except for this feature the circuit has general Colpitts configuration.

Elimination of these resistors from the equivalent circuit is usually advantageous because variation of resistor 26 effects oscillator frequency by unidirectional current control. If this resistor is included in the alternating current circuit it will impose additional control on frequency if it is varied. Thus the order of the function relating frequency to the resistance of element 26 will be increased. In general, the circuit will be found to be easier to calibrate if this function is kept simple. If some complex relation is required it is now considered preferable to alter the taper of resistor 26 or the transducer transfer function and to rely only on unidirectional current control.

The amplifier employs as its active element a transistor 35 having its collector connected to positive line 12 through the parallel combination of bias resistor 36 and by-pass capacitor 37. The emitter of transistor 35 is connected to ground through load resistor 38 and a pair of output terminals are connected to the respective ends of that resistor. Voltage and current levels are established in a voltage divider comprising, in order from line 12 to line 13, the series circuit combination of the parallel combination of resistors 44 and 45, a resistor 46, a junction connected to the base of transistor 35, a resistor 47 and the parallel combination of resistors 48 and 49. Of these, resistors 45 and 49 are temperature sensitive in extraordinary degree and are, in this case, thermistors.

Two capacitors 15A and 35A are shown connected by dashed lines across the base to collector junction of transistors 15 and 35, respectively. These capacitors represent the capacitance exhibited by these junctions. More properly, the movement of electrons across the junctions from association with the donor impurity to association with the acceptor impurity creates an electrostatic field across the junction, the strength of which is altered as junction current changes. In effect, the junction exhibits capacitive reactance in a degree that varies with the magnitude of unidirectional current (or component of current) flowing across the junction. In terms of the embodiment shown, the invention comprises inclusion in the frequency determining circuit of the oscillator of the junction capacitance of the amplifier transistor. Oscillator frequency control is effected by altering this capacitance.

Figure 2:
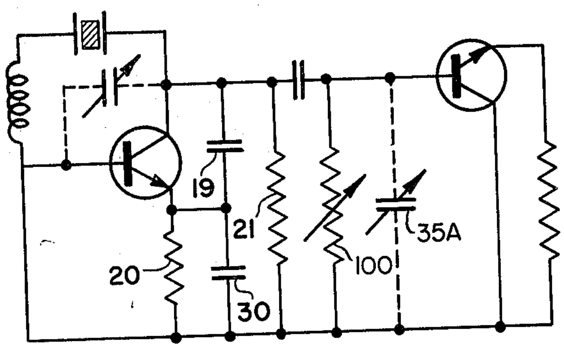
FIGS. 2 and 3 are alternative forms of circuits representing simplified equivalents of the circuit of FIG. 1.

That capacitance 35A is in fact included in the frequency determining circuit of the oscillator is shown by FIG. 2 which defines the alternating current paths of FIG. 1. The variable resistor 100 represents the equivalent of resistors 44 through 49.

Figure 3:
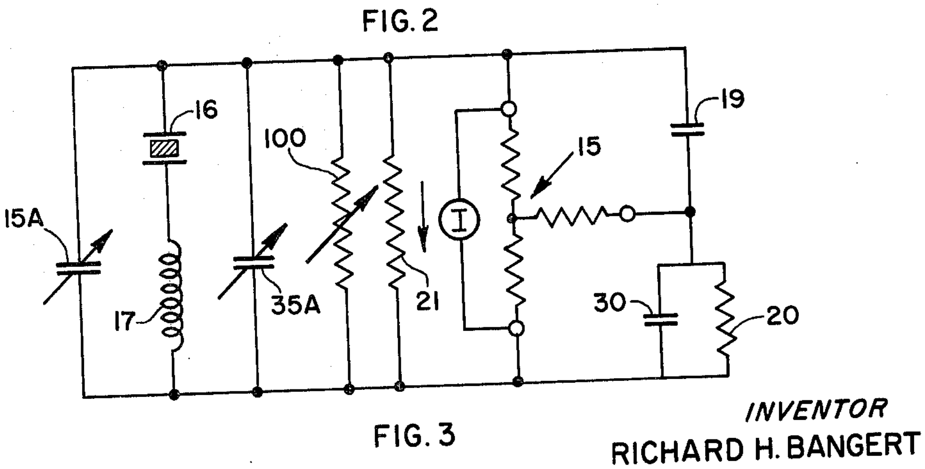

The circuit is further simplified in FIG. 3 to show only the frequency determining circuit. The coupling capacitor 10 has been omitted to show that it has small reactance at the operating frequency whereby the amplifier is tightly coupled to the oscillator. The coupling can be loosened if desired to reduce the degree of control of oscillator frequency. While only approximate, FIGS. 2 and 3 are adequate to show that the junction capacitance 35A does appear in the frequency determining circuit of the oscillator.

The specific design of the temperature compensation voltage divider (resistors 44 and 49) depends upon the crystal cut, the temperature range of crystal operation and the characteristics of the transistor.

Figure 4:
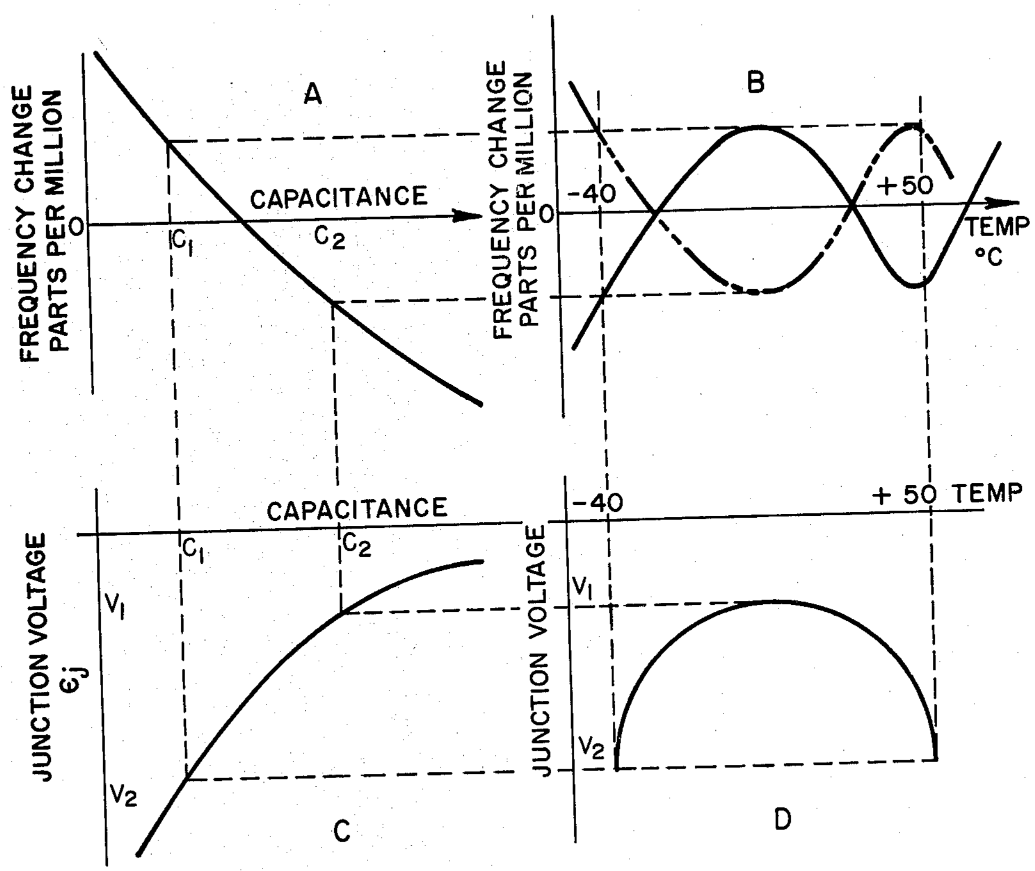
FIG. 4 is a four-part graph illustrating how temperature compensation is accomplished in the circuit of FIG. 1.

The design approach is illustrated in FIG. 4 which shows four interrelated graphs. Graph A shows relative frequency shift against capacitance plotted from the basic relationship—frequency is inversely proportional to the square root of capacitance. Graph C shows the relation of junction capacitance to junction voltage. The capacitance scales of graphs A and C are the same. The solid curve of graph B shows the relation between relative frequency and temperature in degrees centigrade for a representative crystal (AT cut). The dashed line shows the compensation which, when added to the solid curve, cancels frequency deviation over the temperature range. The frequency scales of graphs A and B are the same. Graph D is a plot against temperature of junction voltage required to provide the compensation defined by the dashed curve and to overcome the frequency change with temperature shown in the solid curve of graph B.

It should be noted at this point that the capacitive reactance exhibited by the junction is a function of current flow across the junction. However, the junction current also defines the junction voltage so it is no less accurate to define junction reactance in terms of junction voltage. The latter is, in fact, more common. Accordingly, it has been done in graph C.

Suppose it is desired to compensate for changes in oscillator temperature from minus 50 to plus 40 degrees centigrade. Comparison of graphs A and B shows that a change in capacitance from C1 and C2 changes oscillator frequency as much as does this temperature change. Comparison of graphs A and C shows that the required variation in capacitance is accomplished by changing junction voltage between V1 and V2. Graph D may now be constructed to show the relation between transistor junction voltage and any oscillator temperature.

The next step is to translate the required variation in junction voltage into a voltage variation in the voltage divider—in this case at the base of transistor 35. From the direct current equivalent circuit it can be demonstrated that the following closely approximates the expression for junction voltage, E*j*.

$$Ej\left[\frac{R_1R_2}{R_1\left(B+\frac{R_2}{R_{38}}\right)+BR_2}\right]\left[\frac{B}{R_2}+\frac{1}{R_{38}}-\frac{BR_{36}}{R_{38}R_1}\right]$$

where: E is supply voltage; $R_1$ is the combined resistance of resistors 44, 45, 46; $R_2$ is the combined resistance of resistors 47, 48, and 49; $R_{36}$ and $R_{38}$ are the resistance of resistors 36 and 38, respectively, and B is the current gain of the transistor.

Since E*j* varies with $R_1$, $R_2$, $R_{36}$, and $R_{38}$, any one or any combination of these may be varied with temperature to accomplish the variation required by graph D. A number of schemes are known for changing resistance with temperature. One of the most convenient is the use of thermistors which are available in a wide variety of temperature against resistance characteristics.

An understanding of the character of the variation in E*j* with these variables can be had by finding the derivative of E*j* with respect to each variable for various combinations of fixed values of the other possible variables. Doing this demonstrates that the derivatives of E*j* with respect to $R_2$ and $R_{36}$ are negative and that the derivatives of E*j* with respect to $R_1$ and $R_{38}$ are positive.

It is observed that the current in resistors 36 and 38 is much larger than the base current. If compensation is to be accomplished by thermistors, this fact suggests that it should be accomplished in one or both of $R_1$ and $R_2$ because current here can be made smaller thus to reduce thermistor heating by internal current.

Thermistors having positive temperature coefficients and thermistors having negative temperature coefficients are both available whereby it is possible to produce a voltage against temperature curve like that shown in graph D by a change in only one of $R_1$ and $R_2$. At present the negative temperature coefficient thermistors (resistance increases as temperature decreases) are available in a wider variety of characteristics. The fact that the differentials of E*j* with respect to $R_1$ and $R_2$ have opposite slopes makes it desirable to vary both $R_1$ and $R_2$ primarily with negative coefficient thermistors.

Having reached this or another conclusion on the basis of the sign and magnitude of the differentials and the availability of temperature responsive control elements, a specific voltage network design is synthesized on the basis of known synthesizing procedures and techniques.

Figure 5:
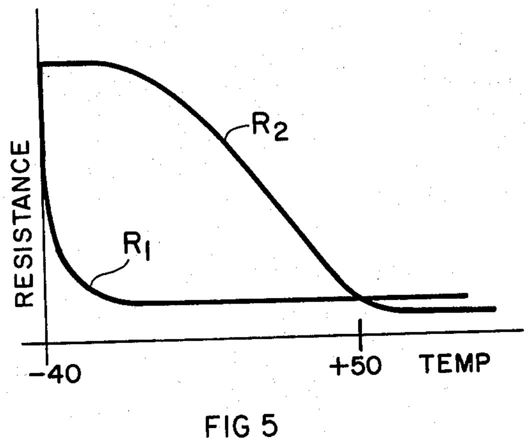
FIG. 5 is a graph illustrating how the value of certain resistors of FIG. 1 change with temperature in accomplishing the compensation illustrated by FIG. 4.

To complete the description of this embodiment, variations in $R_1$ and $R_2$ like those shown in FIG. 5 will, for fixed values of E, $R_{36}$ and $R_{38}$, provide the junction voltage variation required in FIG. 4D.

It is to be understood that in most applications of the invention the primary function of the amplifier will be to isolate the oscillator from the effects of subsequent stages and gain is secondary or unimportant. The isolation function is accomplished by impedance change; the amplifier while presenting high impedance to the oscillator has a low output impedance. Advantageously, this is accomplished, as shown, by connecting the collector of the amplifier transistor to the common ground point (any point whose alternating potential has the same value it has at the negative terminal of the unidirectional source of the oscillator). Thus in the invention the amplifier provides its oscillator frequency control function and it is a feature of the invention that it can provide both functions with a minimum number of components.

I claim:

In an electronic oscillator and amplifier combination in which the amplifier comprises a transistor whose base to collector junction is coupled to the oscillator as an element in the frequency determining circuit of said oscillator and whose emitter is connected to an amplifier output circuit, the improvement for effecting frequency control of said oscillator which comprises, circuit means, including a source, for causing current having a unidirectional component to flow across said junction, and means for altering the magnitude of said unidirectional component in accordance with a condition, said transistor having its base connected to be energized by the output of the oscillator and having its collector connected to a ground point common to the oscillator such that alternating potential at said collector has the value of the alternating potential at said ground point whereby said amplifier is employed to isolate said oscillator from said output circuit as well as to control the frequency of said oscillator.

References Cited by the Examiner

UNITED STATES PATENTS

| | | | |
|---|---|---|---|
| 2,852,746 | 9/1958 | Scheele | 331—177 X |
| 2,946,018 | 7/1960 | Benjamin et al. | 331—116 |
| 2,972,120 | 2/1961 | Kircher et al. | 331—116 X |
| 3,054,966 | 9/1962 | Etherington | 331—176 X |
| 3,076,945 | 2/1963 | Coombs | 331—177 X |

NATHAN KAUFMAN, *Acting Primary Examiner.*

ROY LAKE, JOHN KOMINSKI, *Examiners.*

S. H. GRIMM, *Assistant Examiner.*